(12) United States Patent
Swedek et al.

(10) Patent No.: US 11,701,749 B2
(45) Date of Patent: Jul. 18, 2023

(54) MONITORING OF VIBRATIONS DURING CHEMICAL MECHANICAL POLISHING

(71) Applicant: Applied Materials, Inc., Santa Clara, CA (US)

(72) Inventors: Boguslaw A. Swedek, Cupertino, CA (US); Dominic J. Benvegnu, La Honda, CA (US); Chih Chung Chou, San Jose, CA (US); Nicholas Wiswell, Sunnyvale, CA (US); Thomas H. Osterheld, Mountain View, CA (US); Jeonghoon Oh, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 846 days.

(21) Appl. No.: 16/351,954

(22) Filed: Mar. 13, 2019

(65) Prior Publication Data

US 2019/0283204 A1    Sep. 19, 2019

Related U.S. Application Data

(60) Provisional application No. 62/642,471, filed on Mar. 13, 2018.

(51) Int. Cl.
*B24B 37/04* (2012.01)
*B24B 49/12* (2006.01)
(Continued)

(52) U.S. Cl.
CPC ............ *B24B 37/013* (2013.01); *B24B 37/04* (2013.01); *B24B 49/12* (2013.01); *H01L 22/12* (2013.01); *H01L 22/26* (2013.01)

(58) Field of Classification Search
CPC ..... B24B 37/013; B24B 37/04; B24B 37/105; B24B 37/24; B24B 37/26; B24B 49/003;
(Continued)

(56) References Cited

U.S. PATENT DOCUMENTS 6,059,636 A * 5/2000 Inaba .................... B24B 37/013
                                                              451/41
6,264,532 B1   7/2001 Meloni
(Continued)

FOREIGN PATENT DOCUMENTS

CN        1849198 A      10/2006
CN        1871504 A      11/2006
(Continued)

OTHER PUBLICATIONS

U.S. Appl. No. 14/328,211, Chew et al., filed Jul. 10, 2014.
(Continued)

*Primary Examiner* — Joel D Crandall
*Assistant Examiner* — Arman Milanian
(74) *Attorney, Agent, or Firm* — Fish & Richardson P.C.

(57) ABSTRACT

A chemical mechanical polishing apparatus includes a platen to support a polishing pad, the platen having a recess, a flexible membrane in the recess, and an in-situ vibration monitoring system to generate a signal. The in-situ acoustic monitoring system includes a vibration sensor supported by the flexible membrane and positioned to couple to an underside of the polishing pad.

13 Claims, 3 Drawing Sheets

(51) Int. Cl.
*H01L 21/66* (2006.01)
*B24B 37/013* (2012.01)

(58) Field of Classification Search
CPC ....... B24B 49/105; B24B 49/12; B24B 49/04; B24B 37/005; B24B 37/205; B24B 49/10; B24B 37/0053; B24B 49/00; H01L 22/12; H01L 22/26
USPC .......................................... 451/5; 438/5, 14
See application file for complete search history.

(56) References Cited

U.S. PATENT DOCUMENTS

| | | | |
|---|---|---|---|
| 6,341,995 | B1 | 1/2002 | Lai et al. |
| 6,425,137 | B1 | 6/2002 | Fakhrai |
| 6,416,615 | B1 | 7/2002 | Lai |
| 6,424,137 | B1 | 7/2002 | Sampson |
| 6,431,953 | B1 | 8/2002 | Carter |
| 6,454,630 | B1 | 9/2002 | Tolles |
| 6,488,569 | B1 | 12/2002 | Wang |
| 6,702,646 | B1 | 3/2004 | Gitis |
| 6,722,946 | B2 | 4/2004 | Talieh et al. |
| 6,910,942 | B1 | 6/2005 | Dornfeld et al. |
| 6,934,040 | B1 | 8/2005 | Schietinger et al. |
| 7,024,268 | B1 | 4/2006 | Bennett |
| 7,107,158 | B2 | 9/2006 | Steele |
| 7,112,960 | B2 | 9/2006 | Miller et al. |
| 7,229,340 | B2 | 6/2007 | Hanawa et al. |
| 7,300,332 | B2 | 11/2007 | Kobayashi et al. |
| 7,513,818 | B2 | 4/2009 | Miller et al. |
| 8,987,050 | B1 | 3/2015 | Hiner |
| 9,403,254 | B2 | 8/2016 | Hwang et al. |
| 2002/0016066 | A1 | 2/2002 | Birang |
| 2002/0173223 | A1 | 11/2002 | Gitis |
| 2003/0049993 | A1 | 3/2003 | Fujii |
| 2003/0092269 | A1 | 5/2003 | Parikh |
| 2004/0192169 | A1* | 9/2004 | Kimura ................ B24B 37/205 451/6 |
| 2005/0042975 | A1 | 2/2005 | Jeffrey et al. |
| 2005/0136800 | A1 | 6/2005 | Miller et al. |
| 2005/0142991 | A1 | 6/2005 | Nakao et al. |
| 2006/0000807 | A1 | 1/2006 | Golzarian |
| 2006/0087647 | A1 | 4/2006 | Bagley |
| 2007/0049167 | A1 | 3/2007 | Swedek et al. |
| 2007/0087662 | A1* | 4/2007 | Benvegnu ............... G01N 19/02 451/5 |
| 2007/0218806 | A1 | 9/2007 | Kistler |
| 2008/0004743 | A1 | 1/2008 | Goers et al. |
| 2008/0207089 | A1 | 8/2008 | Lehman et al. |
| 2009/0008794 | A1 | 1/2009 | Wu |
| 2009/0212438 | A1 | 8/2009 | Kreupl |
| 2010/0099100 | A1 | 4/2010 | Zaccarin |
| 2011/0016975 | A1 | 1/2011 | Glaesemann |
| 2012/0196511 | A1 | 8/2012 | David et al. |
| 2012/0315826 | A1 | 12/2012 | Lu et al. |
| 2013/0044004 | A1 | 2/2013 | Hwang et al. |
| 2013/0109278 | A1 | 5/2013 | Kimba |
| 2014/0027407 | A1 | 1/2014 | Deshpande et al. |
| 2014/0232013 | A1 | 8/2014 | Wu |
| 2016/0013085 | A1* | 1/2016 | Chew ................. H01L 21/76898 156/345.13 |
| 2016/0256978 | A1* | 9/2016 | Tang ..................... B24B 37/013 |
| 2018/0056476 | A1 | 3/2018 | Zhang et al. |

FOREIGN PATENT DOCUMENTS

| | | |
|---|---|---|
| CN | 201724692 | 1/2011 |
| CN | 102245350 A | 11/2011 |
| CN | 102956521 A | 3/2013 |
| CN | 105659363 | 6/2016 |
| CN | 206111937 | 4/2017 |
| CN | 106706211 | 5/2017 |
| CN | 107427987 | 12/2017 |
| JP | 2000-301454 | 10/2000 |
| JP | 2005-203729 | 7/2005 |
| JP | 2007-510164 | 4/2007 |
| JP | 2008-241700 | 10/2008 |
| JP | 2008-286766 | 11/2008 |
| JP | 2010-064220 | 3/2010 |
| JP | 2010-179406 | 8/2010 |
| TW | 536454 | 6/2003 |
| TW | 200513349 | 4/2005 |
| TW | 200518878 | 6/2005 |
| TW | 200819243 | 5/2008 |
| TW | 201236813 | 9/2015 |
| WO | WO 2000/058716 | 10/2000 |
| WO | WO 2001/048801 | 7/2001 |
| WO | WO 2004/048038 | 6/2004 |
| WO | WO 2014/179241 | 11/2014 |
| WO | WO 2015/066058 | 5/2015 |
| WO | WO 2015/195284 | 12/2015 |

OTHER PUBLICATIONS

International Search Report and Written Opinion in International Application No. PCT/US2019/021999, dated Jun. 25, 2019, 13 pages.

Tang, J. et al. Low-K Dielectric Material Chemical Mechanical Polishing Process Monitoring Using Acoustic Emission. MRS Symp. Proc. vol. 476. Apr. 1997. 6 pages.

Tobias, A. Acoustic-Emission Source Location in Two Dimensions By An Array of Three Sensors. Non-Destructive Test., Feb. 9, 1976. pp. 9-12.

Ziola, S. et al. Source Location in Thin Plates Using Cross-Correlation. J. of Acoustic Society of America, Issue 90, vol. 5. Nov. 1991. (Dissertation, Naval Postgraduate School, Monterey California). 115 pages.

Office Action in Chinese Appln No. 201980005304.8, dated Feb. 21, 2022, 13 pages (with English translation).

Office Action in Japanese Appln. No. 2020-547185, dated Oct. 31, 2022, 6 pages (with English translation).

Office Action in Chinese Appln. No. 201980005304.8, dated Aug. 3, 2022, 10 pages (with English translation).

\* cited by examiner

MONITORING OF VIBRATIONS DURING CHEMICAL MECHANICAL POLISHING

CROSS-REFERENCE TO RELATED APPLICATIONS

This application claims priority to U.S. Application Ser. No. 62/642,471, filed on Mar. 13, 2018, the disclosure of which is incorporated by reference.

TECHNICAL FIELD

This disclosure relates to in-situ monitoring of chemical mechanical polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the metallic layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry distribution, the polishing pad condition, the relative speed between the polishing pad and the substrate, and the load on the substrate can cause variations in the material removal rate. These variations, as well as variations in the initial thickness of the substrate layer, cause variations in the time needed to reach the polishing endpoint. Therefore, the polishing endpoint usually cannot be determined merely as a function of polishing time.

In some systems, the substrate is monitored in-situ during polishing, e.g., by monitoring the torque required by a motor to rotate the platen or carrier head. Acoustic monitoring of polishing has also been proposed. However, existing monitoring techniques may not satisfy increasing demands of semiconductor device manufacturers.

SUMMARY

As noted above, acoustic monitoring of chemical mechanical polishing has been proposed. By providing both a sensor and a portion of the polishing pad that is movable relative to the platen, the sensor can pick up the vibration behavior selectively localized to the portion.

In one aspect, a chemical mechanical polishing apparatus includes a platen to support a polishing pad, the platen having a recess, a flexible membrane in the recess, and an in-situ vibration monitoring system to generate a signal. The in-situ vibration monitoring system includes a vibration sensor supported by the flexible membrane and positioned to couple to an underside of the polishing pad.

Implementations may include one or more of the following features.

The polishing pad may have a polishing layer and a backing layer. There may be an aperture in the backing layer, and the vibration sensor may directly contacts an underside of the polishing layer. The polishing pad may have a pad portion coupled to a remainder of the polishing pad by a material that is softer than the pad portion. The material may completely laterally surround the pad portion. The pad portion and the remainder of the polishing pad may have the same material composition. The polishing layer may have grooves, and the material may be positioned at the bottom of the grooves.

A volume below the flexible membrane may be pressurizable. The flexible membrane may provide an inflatable balloon. The flexible membrane may extend across the recess to seal the volume below the flexible membrane. A pump may pressurize the volume and urge the vibration sensor into contact with the polishing pad.

A controller may be configured to receive signals from the vibration sensor and detect a polishing endpoint. The controller may be configured to detect exposure of an underlying layer.

Implementations can include one or more of the following potential advantages. An acoustic or vibration sensor can have a stronger signal. Exposure of an underlying layer can be detected more reliably. Polishing can be halted more reliably, and wafer-to-wafer uniformity can be improved.

The details of one or more embodiments are set forth in the accompanying drawings and the description below. Other aspects, features and advantages will be apparent from the description and drawings, and from the claims.

DESCRIPTION OF DRAWINGS

Like reference symbols in the various drawings indicate like elements.

DETAILED DESCRIPTION

In general, in chemical mechanical polishing, a material removal process can accompanied by continuous stick/slip action between the polishing pad and the substrate; this stick/slip action should generate distinctive vibration characteristics (e.g., frequency or amplitude) depending on the process conditions and the material being polished. In some semiconductor chip fabrication processes an overlying layer, e.g., metal, silicon oxide or polysilicon, is polished until an underlying layer, e.g., a dielectric, such as silicon oxide, silicon nitride or a high-K dielectric, is exposed. When the underlying layer is exposed, the stick/slip action between the polishing pad and the substrate will change, and thus the vibrations (e.g., frequency spectrum of the vibrations) in the polishing pad will change. The polishing endpoint can be determined by detecting this change in vibrations.

The vibrations to be monitored can be caused when the polishing pad is stretched and released as part of the continuous stick/slip action. These vibrations are not necessarily the same as noise simply generated by friction of the substrate against the polishing pad (which is also sometimes referred to as an acoustic signal); the vibrations can occur in a different frequency range than other frictional noise.

However, a potential problem with acoustic monitoring is damping of the vibrations. In particular, if the polishing pad is secured to the platen, e.g., by adhesive, this will tend to dampen vibration of the polishing pad. Thus, it would be advantageous to have the polishing pad configured for good transmission of the signal, and have the sensor in a position with low attenuation of the signal.

Figure 1:
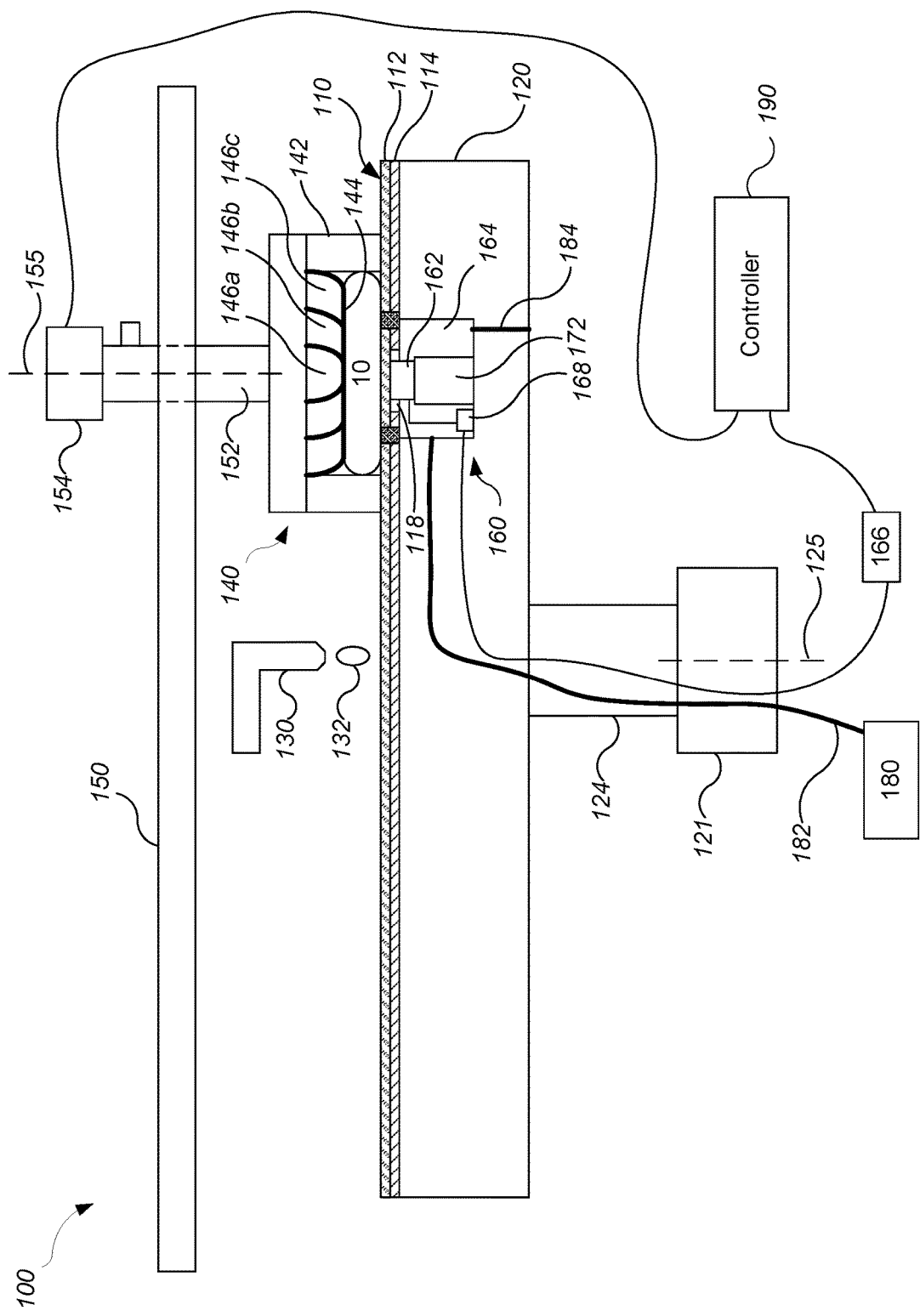
FIG. 1 illustrates a schematic cross-sectional view of an example of a polishing apparatus.

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121, e.g., a DC induction motor, can turn a drive shaft 124 to rotate the platen 120.

The polishing pad 110 can be a two-layer polishing pad with an outer polishing layer 112 and a softer backing layer 114. In some implementations, a plurality of slurry-transport grooves 116 (see FIG. 2) are formed in the top surface of the polishing layer 112 of the polishing pad 110. The grooves 116 extend partially but not entirely through the thickness of the polishing layer 112.

The polishing apparatus 100 can include a port 130 to dispense polishing liquid 132, such as abrasive slurry, onto the polishing pad 110. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. Each carrier head 140 can have independent control of the polishing parameters, for example pressure, associated with each respective substrate.

The carrier head 140 can include a retaining ring 142 to retain the substrate 10 below a flexible membrane 144. The carrier head 140 also includes one or more independently controllable pressurizable chambers defined by the membrane, e.g., three chambers 146a-146c, which can apply independently controllable pressurizes to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or track, and is connected by a drive shaft 152 to a carrier head rotation motor 154, e.g., a DC induction motor, so that the carrier head can rotate about an axis 155. Optionally each carrier head 140 can oscillate laterally, e.g., on sliders on the carousel 150, or by rotational oscillation of the carousel itself, or by sliding along the track. In typical operation, the platen is rotated about its central axis 125, and each carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

A controller 190, such as a programmable computer, is connected to the motors 121, 154 to control the rotation rate of the platen 120 and carrier head 140. For example, each motor can include an encoder that measures the rotation rate of the associated drive shaft. A feedback control circuit, which could be in the motor itself, part of the controller, or a separate circuit, receives the measured rotation rate from the encoder and adjusts the current supplied to the motor to ensure that the rotation rate of the drive shaft matches at a rotation rate received from the controller.

The polishing apparatus 100 includes at least one in-situ pad vibration monitoring system 160. The in-situ pad vibration monitoring system 160 includes one or more vibration sensors 162. Each vibration sensor 162 can be installed at one or more locations on the upper platen 120. In particular, the in-situ acoustic monitoring system can be configured to detect acoustic emissions caused by caused by stress energy when the material of the substrate 10 undergoes deformation.

A position sensor, e.g., an optical interrupter connected to the rim of the platen or a rotary encoder, can be used to sense the angular position of the platen 120. This permits only portions of the signal measured when the sensor 162 is in proximity to the substrate, e.g., when the sensor 162 is below the carrier head or substrate, to be used in endpoint detection.

Figure 2:
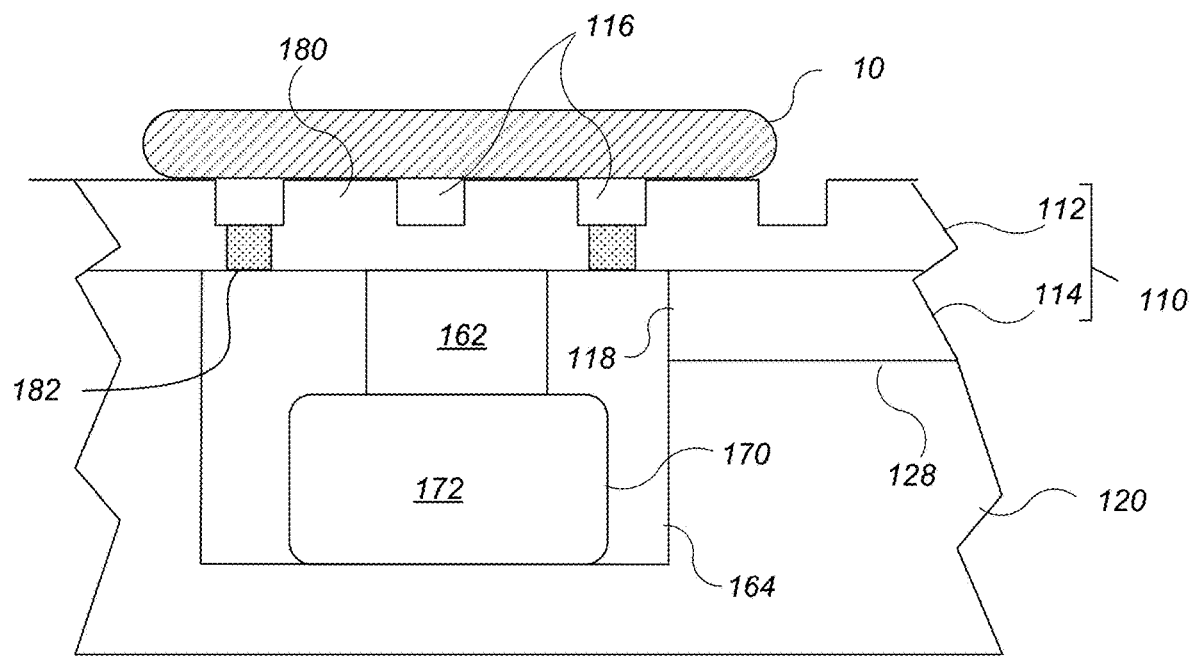
FIG. 2 illustrates a schematic cross-sectional view of a vibration monitoring sensor that engages a portion of a polishing pad.

In the implementation shown in FIGS. 1 and 2, the vibration sensor 162 is positioned in or above a recess 164 in the platen 120 and is in contact with an underside of the polishing pad 110. In some implementations, an aperture 118 is formed in the backing layer 114, and the vibration sensor 162 is in direct contact with the underside of the polishing layer 112.

The sensor 162 can be connected by circuitry 168 to a power supply and/or other signal processing electronics 166 through a rotary coupling, e.g., a mercury slip ring. The signal processing electronics 166 can be connected in turn to the controller 190. The signal from the sensor 162 can be amplified by a built-in internal amplifier. The signal from the sensor 162 can then be further amplified and filtered if necessary, and digitized through an A/D port to a high speed data acquisition board, e.g., in the electronics 166. Data from the sensor 162 can be recorded at 1 to 3 Mhz.

Figure 4:
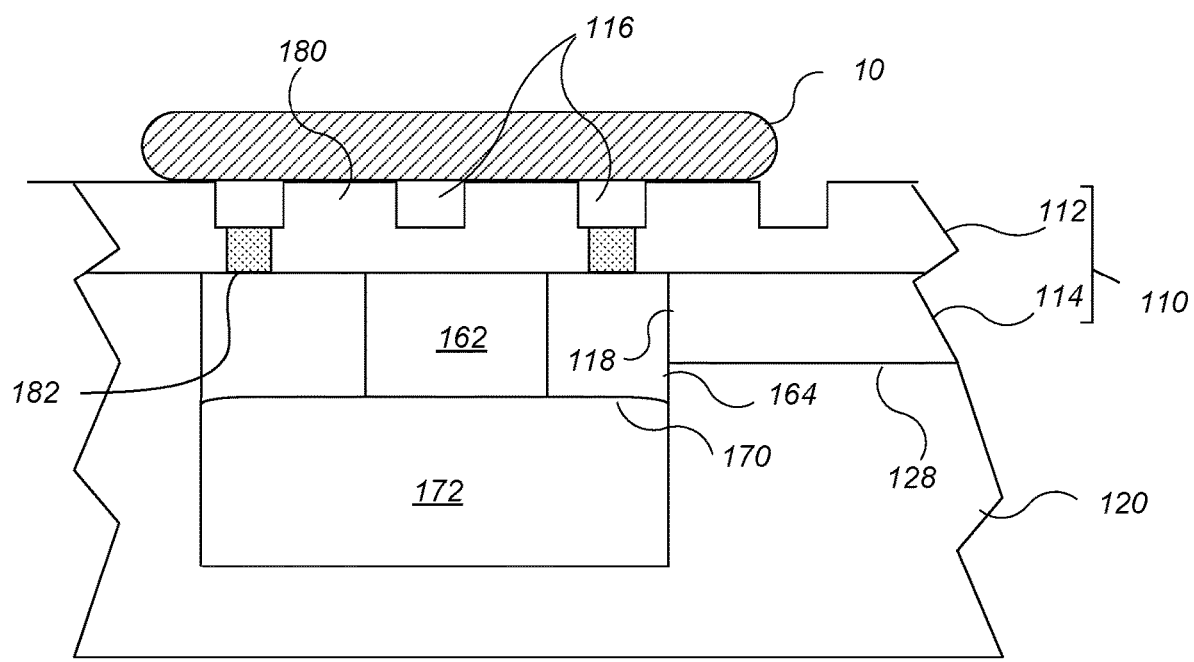
FIG. 4 illustrates a schematic cross-sectional view of another implementation of a vibration monitoring sensor that engages a portion of a polishing pad.

The vibration sensor 162 can be supported by a flexible and inflatable membrane 170 positioned in the recess 164. In some implementations, the membrane 170 forms a balloon-like structure 172 between the bottom of recess 164 and the vibration sensor 162. Alternatively, as shown in FIG. 4, the membrane 170 can simply stretch across a portion of the recess 164 to form a pressurizable volume below the top surface of the membrane 170.

Pressurization of the volume below or inside the membrane 170 can bias the sensor 162 into contact with the polishing pad 110. On the other hand, the flexible membrane, e.g., a balloon-like structure, permits the sensor 162 to be effectively decoupled from the platen 120 in all three axes (two parallel to the surface of the polishing pad and one perpendicular to the surface of the polishing pad). This permits the sensor 162 to operate without being hindered by the structural influence of the platen 120.

Figure 3:
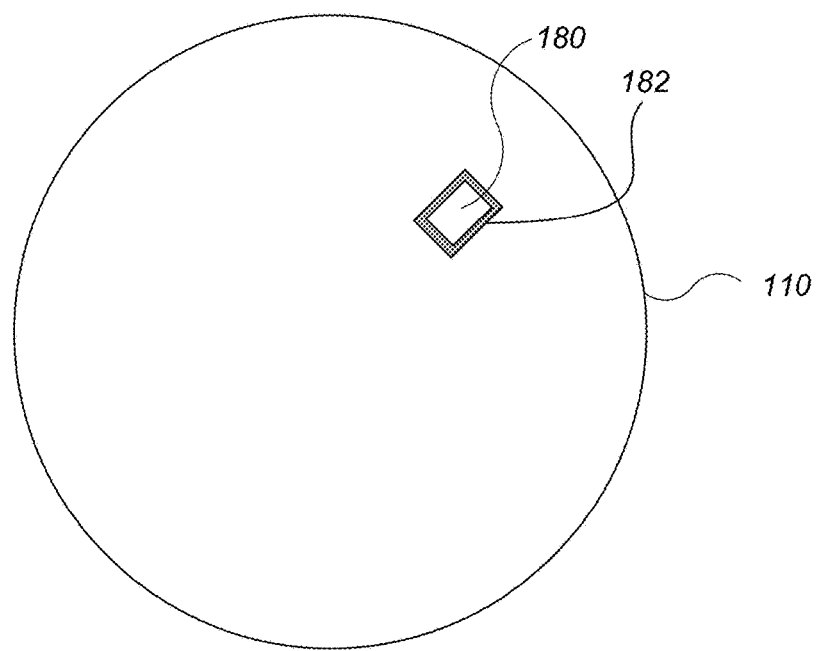
FIG. 3 illustrates a schematic top view of a platen having a vibration monitoring sensor.

In addition, referring to FIGS. 2 and 3, a portion 180 of the polishing pad 110 which contacts the sensor 162 can be vibrationally isolated from a remainder of the polishing pad by a softer material 182. This permits the pad portion 180 attached to the sensor 180 162 to translate relative to the remainder of the polishing pad 110. Thus, the sensor 162 can operate without being hindered by the structural rigidity from the remainder of the polishing pad 110 (e.g., the attachment of the polishing pad to the platen). The softer material 182 can completely surround the portion 180. The pad portion 180 can be circular, rectangular, etc. The pad portion 180 is of the same material as the remainder of the polishing layer 112.

Although FIG. 2 illustrates the softer material 182 as positioned at the bottom of grooves 116, this is not necessary; the softer material 182 can be located in a region of the full thickness of the polishing layer 112, and can extend through the backing layer 114 as well (e.g., see FIG. 1).

The vibration sensor 162 can be located at the center of the platen 120, e.g., at the axis of rotation 125, at the edge of the platen 120, or at a midpoint (e.g., 5 inches from the axis of rotation for a 20 inch diameter platen).

Returning to FIG. 1, as the portion 180 of the polishing pad rotates under the substrate 10, the stick/slip action between the portion 180 and the substrate 10 will cause certain vibration characteristics. However, because the portion 180 and sensor 162 are free standing from the rest of the polishing pad 110 and platen 120, the sensor can pick up the vibration behavior selectively from the pad portion 180.

In some implementations, a gas can be directed into the recess 164. For example, a gas, e.g., air or nitrogen, can be directed from a pressure source 180, e.g., a pump or gas supply line, through a conduit 182 provided by tubing and/or a passage in the platen 120 into the recess 164. An exit port 184 can connect the recess 164 to the external environment and permit escape of the gas from the recess 164. The gas flow can pressurize the recess 164 to reduce leakage of slurry into recess 164 and/or purge slurry that leaks into the recess 164 out through the exit port 184 to reduce the likelihood of damage to the electronics or other components of the contamination of the sensor 162.

The signal from the sensor 162, e.g., after amplification, preliminary filtering and digitization, can be subject to data processing, e.g., in the controller 190, for either endpoint detection or feedback or feedforward control.

In some implementations, a frequency analysis of the signal is performed. For example, a Fast Fourier Transform (FFT) can be performed on the signal to generate a frequency spectrum. A particular frequency band can be monitored, and if the intensity in the frequency band crosses a threshold value, this can indicate exposure of an underlying layer, which can be used to trigger endpoint. Alternatively, if the width of a local maxima or minima in a selected frequency range crosses a threshold value, this can indicate exposure of an underlying layer, which can be used to trigger endpoint.

As another example, a wavelet packet transform (WPT) can be performed on the signal to decompose the signal into a low-frequency component and a high frequency component. The decomposition can be iterated if necessary to break the signal into smaller components. The intensity of one of the frequency components can be monitored, and if the intensity in the component crosses a threshold value, this can indicate exposure of an underlying layer, which can be used to trigger endpoint.

A device substrate can be polished, e.g., after the threshold values have been determined experimentally. A device substrate is polished at the polishing station and an vibration signal is collected from the in-situ vibration monitoring system.

The signal is monitored to detect exposure of the underlying layer. For example, a specific frequency range can be monitored, and the intensity can be monitored and compared to a threshold value.

Detection of the polishing endpoint triggers halting of the polishing, although polishing can continue for a predetermined amount of time after endpoint trigger. Alternatively or in addition, the data collected and/or the endpoint detection time can be fed forward to control processing of the substrate in a subsequent processing operation, e.g., polishing at a subsequent station, or can be fed back to control processing of a subsequent substrate at the same polishing station.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The above described polishing apparatus and methods can be applied in a variety of polishing systems. Either the polishing pad, or the carrier head, or both can move to provide relative motion between the polishing surface and the wafer. For example, the platen may orbit rather than rotate. The polishing pad can be a circular (or some other shape) pad secured to the platen. Some aspects of the endpoint detection system may be applicable to linear polishing systems (e.g., where the polishing pad is a continuous or a reel-to-reel belt that moves linearly). The polishing layer can be a standard (for example, polyurethane with or without fillers) polishing material, a soft material, or a fixed-abrasive material. Terms of relative positioning are used; it should be understood that the polishing surface and wafer can be held in a vertical orientation or some other orientations.

While this specification contains many specifics, these should not be construed as limitations on the scope of what may be claimed, but rather as descriptions of features that may be specific to particular embodiments of particular inventions. In some implementations, the method could be applied to other combinations of overlying and underlying materials, and to signals from other sorts of in-situ monitoring systems, e.g., optical monitoring or eddy current monitoring systems.

What is claimed is:

1. A chemical mechanical polishing apparatus, comprising:
   a platen supporting a polishing pad, the platen having a recess, and wherein the polishing pad has a polishing layer and a backing layer, and a pad portion coupled to a remainder of the polishing pad by a material that is softer than the pad portion;
   a flexible membrane in the recess, wherein the flexible membrane defines a pressurizable volume in the recess below the flexible membrane, wherein the pressurizable volume is entirely contained within the flexible membrane; and
   an in-situ vibration monitoring system to generate a signal, the in-situ vibration monitoring system including a vibration sensor supported by the flexible membrane and positioned to couple to an underside of the polishing pad.

2. The apparatus of claim 1, comprising an aperture in the backing layer, and wherein the vibration sensor directly contacts an underside of the polishing layer.

3. The apparatus of claim 1, wherein the material completely laterally surrounds the pad portion.

4. The apparatus of claim 1, the pad portion of the polishing pad and the remainder of the polishing pad have the same material composition.

5. The apparatus of claim 1, wherein the polishing layer has grooves, and the material is positioned at the bottom of the grooves.

6. The apparatus of claim 1, wherein the flexible membrane extends across the recess to seal the volume below the flexible membrane.

7. The apparatus of claim 1, comprising a pump to pressurize the volume and urge the vibration sensor into contact with the polishing pad.

8. The apparatus of claim 1, comprising a controller configured to receive signals from the vibration sensor and detect a polishing endpoint.

9. The apparatus of claim 8, wherein the controller is configured to detect exposure of an underlying layer.

10. A chemical mechanical polishing apparatus, comprising:
    a platen to support a polishing pad, the platen having a recess;
    a flexible membrane in the recess which extends across the recess to seal a volume below the flexible membrane and forms a pressurizable chamber;
    an in-situ vibration monitoring system to generate a signal, the in-situ vibration monitoring system including a vibration sensor supported by the flexible membrane and positioned to couple to an underside of the polishing pad; and
    a pump to pressurize the chamber and urge the vibration sensor into contact with the underside of the polishing pad.

11. The apparatus of claim 10, wherein the flexible membrane provides an inflatable balloon.

12. A chemical mechanical polishing apparatus, comprising:
    a platen having a recess, wherein the recess has a bottom surface and sidewalls;
    a polishing pad supported on the platen, wherein the polishing pad has a polishing layer and a backing layer, and a pad portion coupled to a remainder of the polishing pad by a material that is softer than the pad portion;
    a flexible membrane extending between the sidewalls of the recess, wherein the flexible membrane defines a pressurizable volume between the bottom of the recess and the flexible membrane; and
    an in-situ vibration monitoring system to generate a signal, the in-situ vibration monitoring system including a vibration sensor supported by the flexible membrane and positioned to couple to an underside of the polishing pad.

13. The apparatus of claim 12, wherein the flexible membrane decouples the sensor from the platen in three perpendicular axes.

* * * * *